US011189588B2

(12) United States Patent
Nakano et al.

(10) Patent No.: US 11,189,588 B2
(45) Date of Patent: Nov. 30, 2021

(54) ANISOTROPIC CONDUCTIVE FILM WITH CARBON-BASED CONDUCTIVE REGIONS AND RELATED SEMICONDUCTOR ASSEMBLIES, SYSTEMS, AND METHODS

(71) Applicant: Micron Technology, Inc., Boise, ID (US)

(72) Inventors: Eiichi Nakano, Boise, ID (US); Mark E. Tuttle, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/236,687

(22) Filed: Dec. 31, 2018

(65) Prior Publication Data
US 2020/0211996 A1 Jul. 2, 2020

(51) Int. Cl.
*H01L 23/48* (2006.01)
*H01L 23/00* (2006.01)
*H01L 25/065* (2006.01)

(52) U.S. Cl.
CPC .............. *H01L 24/29* (2013.01); *H01L 24/27* (2013.01); *H01L 24/83* (2013.01); *H01L 25/0657* (2013.01); *H01L 2224/279* (2013.01); *H01L 2224/2919* (2013.01); *H01L 2224/29076* (2013.01); *H01L 2224/29147* (2013.01);
(Continued)

(58) Field of Classification Search
CPC ......... H01L 24/29; H01L 24/27; H01L 24/83; H01L 25/0657; H01L 2224/83851; H01L 2224/29155; H01L 2224/2919; H01L 2224/29076; H01L 2224/279; H01L 2224/29147
See application file for complete search history.

(56) References Cited

U.S. PATENT DOCUMENTS 7,105,930 B2 9/2006 Lua et al.
7,326,633 B2 2/2008 Chen
(Continued)

OTHER PUBLICATIONS

Song et al., Highly Anisotropic Thermal Conductivity of Layer-by-Layer Assembled Nanofibrillated Cellulose/Graphene Nanosheets Hybrid Films for Thermal Management, ACS Appl. Mater. Interfaces, vol. 9, No. 3 (Jan. 3, 2017), pp. 2924-2932 (abstract only).
(Continued)

*Primary Examiner* — Cuong B Nguyen
(74) *Attorney, Agent, or Firm* — TraskBritt (57) ABSTRACT

An anisotropic conductive film (ACF) is formed with an ordered array of discrete regions that include a conductive carbon-based material. The discrete regions, which may be formed at small pitch, are embedded in at least one adhesive dielectric material. The ACF may be used to mechanically and electrically interconnect conductive elements of initially-separate semiconductor dice in semiconductor device assemblies. Methods of forming the ACF include forming a precursor structure with the conductive carbon-based material and then joining the precursor structure to a separately-formed structure that includes adhesive dielectric material to be included in the ACF. Sacrificial materials of the precursor structure may be removed and additional adhesive dielectric material formed to embed the discrete regions with the conductive carbon-based material in the adhesive dielectric material of the ACF.

34 Claims, 6 Drawing Sheets

(52) U.S. Cl.
CPC ............... *H01L 2224/29155* (2013.01); *H01L 2224/83851* (2013.01)

(56) References Cited

U.S. PATENT DOCUMENTS

| | | | |
|---|---|---|---|
| 7,470,416 | B2 | 12/2008 | Ishida |
| 8,097,947 | B2 | 1/2012 | Lua et al. |
| 8,178,201 | B2 | 5/2012 | Lee et al. |
| 8,586,871 | B2 | 11/2013 | Bernstein et al. |
| 8,969,154 | B2 | 3/2015 | Sandhu |
| 9,520,206 | B2 | 12/2016 | Ji et al. |
| 9,536,953 | B2 | 1/2017 | Elian et al. |
| 9,953,957 | B2 | 4/2018 | Gao et al. |
| 10,217,726 | B1 | 2/2019 | Nakano |
| 10,319,696 | B1 | 6/2019 | Nakano |
| 2006/0234056 | A1* | 10/2006 | Huang ............... H01L 23/373 428/408 |
| 2007/0003472 | A1* | 1/2007 | Toit .................. H01J 9/025 423/447.3 |
| 2008/0087646 | A1* | 4/2008 | Liu ..................... C08K 7/24 216/96 |
| 2010/0051331 | A1* | 3/2010 | Tsai .................... H05K 1/056 174/256 |
| 2016/0276281 | A1 | 9/2016 | Sato |
| 2018/0297849 | A1* | 10/2018 | Liu ..................... H01M 4/96 |
| 2019/0051592 | A1 | 2/2019 | Kim et al. |
| 2019/0067253 | A1 | 2/2019 | Nakano |
| 2019/0172724 | A1 | 6/2019 | Nakano |
| 2019/0378781 | A1* | 12/2019 | Hedrick ............... C08K 3/041 |
| 2020/0006290 | A1 | 1/2020 | Chang et al. |
| 2020/0075532 | A1* | 3/2020 | Hotta .................. H01R 43/20 |
| 2020/0098621 | A1 | 3/2020 | Bharath et al. |

OTHER PUBLICATIONS

Liu et al., Anisotropic Conductive Films Based on Highly Aligned Polyimide Fibers Containing Hybrid Materials of Graphene Nanoribbons and Carbon Nanotubes, Nanoscale, vol. 7, No. 3, (Jan. 21, 2015), pp. 1037-1046 (abstract only).

Kim et al., A Role for Graphene in Silicon-Based Semiconductor Devices, Nature, vol. 479, (Nov. 17, 2011), pp. 338-344.

\* cited by examiner

ANISOTROPIC CONDUCTIVE FILM WITH CARBON-BASED CONDUCTIVE REGIONS AND RELATED SEMICONDUCTOR ASSEMBLIES, SYSTEMS, AND METHODS

TECHNICAL FIELD

The disclosure, in various embodiments, relates generally to conductive adhesives for mechanical and electrical connection between semiconductor device components. More particularly, embodiments disclosed herein relate to anisotropic conductive films with carbon-based conductive regions, methods for fabricating the same and related semiconductor assemblies and systems.

BACKGROUND

In the manufacture of semiconductor devices and systems, a large number of semiconductor devices may be fabricated on a wafer or other bulk substrate of semiconductive material, such as on a silicon wafer. Each semiconductor device comprises a chip, also termed a "die," of semiconductor material onto which are fabricated integrated circuitry comprising various electronic components, such as transistors, inductors, resistors, and capacitors, all interconnected to form a useful device. The wafer may then be subdivided, or "singulated," to form discrete dice. The dice may be protectively packaged, either prior to or following singulation.

Semiconductor package assemblies may be formed of multiple dice, and it is common for a single die to have multiple integrated functional circuits, resulting in a large number of input/output (I/O) terminals for signal transmission, power supply, ground (or bias), and, optionally, testing. Also, there has been a continuing interest in the industry to increase the functional density of integrated circuitry of dice while simultaneously decreasing the size of the critical dimensions of circuitry components. While the increased density and decreased size lead to more functionality per area of a die, they tend to also complicate the structures and processes for making electrical and mechanical connections between initially-separate electrical components, such as singulated dice.

In general, the circuits on a die terminate in conductive structures (e.g., conductive traces, bond pads, or other terminals) for I/O functions arrayed on the die's active surface, in some instances in one or more rows about the periphery or across a central portion of the die. Other conventional I/O arrangements include bond pads arranged in an array of rows and columns over a substantial portion of the active surface of the die. Such arrangements are especially suitable when multi-die assemblies of vertically superimposed dice (e.g., memory dice in the form of dynamic random access memory (DRAM) dice) are fabricated. The dice of such assemblies—with the exception, in most instances, of an uppermost die—include conductive, through-substrate vias (TSVs) extending—from bond pads with conductive pillars thereon on the active surface— vertically through a thickness of the die to terminal surfaces in the form of end pads on an opposing back side of the die. This configuration enables stacking of multiple dice (e.g., four dice, eight dice, twelve dice, etc.) using the conductive pillars and TSVs to interconnect the dice and to connect the assembly to another component, e.g., a logic controller die at the bottom of the stack.

When fabricating a multi-die, stacked die assembly of dice configured with TSVs and pillars, a number of acts are performed. For example, in some instances the pillars are topped with solder caps, followed by a reflow operation (e.g., heating) to cause the solder to reflow and bond to terminal surfaces of TSVs of another, aligned die. In other instances, the conductive pillars (e.g., copper pillars) are diffusion bonded in a thermocompression bonding process to the terminal surfaces of an adjacent die. Further, a dielectric underfill material (e.g., a capillary underfill or a non-conductive film (NCF)) is interposed between vertically adjacent dice, surrounding the pillars, electrically isolating laterally adjacent pillars, preventing contaminants entering between the dice, and adhesively securing the dice together. The foregoing fabrication techniques, while practical, take substantial time, require complex, capital-intensive equipment, place limitations on the minimum vertical standoff distance between adjacent dice, require multiple acts, and are somewhat pitch-and-pillar limited due to conductivity limitations and resistance of the conductive pillars. In addition, these techniques require extremely precise alignment of the vertically stacked dice to ensure adequate surface area overlap between conductive pillars to the terminal surfaces of the TSVs. Alignment issues become more problematic with a greater number of stacked dice, as alignment errors accumulate.

Efforts have been made to enable electrical connections between components of electronic assemblies by means of anisotropic conductive films (ACFs), e.g., adhesive films that include conventional, metal conductive materials configured for electrical communication in a selected direction (e.g., a direction perpendicular to the plane of the film, e.g., a vertical direction) without electrical shorting in another direction (e.g., in a direction of the plane of the film, e.g., a horizontal direction). An ACF may also be known in the industry as "z-axis tape" or "z-axis film." Where components are to be joined, one component is arranged to overlap with one vertically above the other and with an ACF in between in such a manner as to effectively electrically connect conductive elements of the lower and upper components via the conductive regions in the ACF, without electrical shorting in the lateral direction. While conventional ACFs have been effective in providing electrical and mechanical connection between dice (or a die and substrate), improving the electrical connections achievable by ACFs and designing ACFs for effective use with dice and substrates having electrical components at ever smaller critical dimensions and pitches continues to present challenges.

DETAILED DESCRIPTION

An anisotropic conductive film (ACF) containing small-pitched, discrete, laterally-spaced regions of carbon-based material is disclosed, along with related semiconductor assemblies, systems, and methods. The carbon-based material of the ACF may exhibit extremely low electrical resistivity, enabling the ACF to effectively electrically connect conductive elements of adjoining dice (or an adjoining die and substrate) including dice or substrates with a high density of small-dimensioned elements. The ACF may also be formed to be thin (e.g., of a relatively small vertical height), which may allow fabrication of vertically compact semiconductor device assemblies comprising multiple, stacked dice (e.g., compact semiconductor device packages). Also, the carbon-based material may be formed, with a high temperature formation process, on a substrate prior to forming adhesive dielectric material of the final ACF structure. Thus, the high temperature process for forming the carbon-based material may not detrimentally impact the formation of the adhesive dielectric material or thermally degrade the adhesive dielectric material.

As used herein, the term "carbon-based," when referring to a material, means and includes a material comprising at least 50 at. % carbon, consisting essentially of carbon or a carbon allotrope, or consisting of carbon or a carbon allotrope. "Carbon-based" materials include, but are not necessarily limited to the carbon allotropes of graphene, carbon nanotubes, carbon nanobuds, and carbon nanoribbons.

As used herein, the term "low resistivity," when referring to an exhibited property of a material, refers to an electrical resistance or electrical resistivity on the order of about $10^{-6}$ Ω·cm or less.

As used herein, the term "substrate" means and includes a base material or other construction upon which components, such as those of integrated circuitry may be formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI")

substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions on or in a base semiconductor structure or foundation.

As used herein, the term "wafer" means and includes not only a conventional, substantially circular wafer of a single material (e.g., a single crystal silicon), but also other bulk substrates in the form of a silicon-on-insulator (SOI) structure, as well as bulk substrates comprising other materials (e.g., semiconductor materials (e.g., germanium, gallium arsenide)), as well as substrates employed in fabrication of structures thereon, such as RDLs, which substrates may comprise other materials such as glasses or ceramics, in addition to the foregoing.

As used herein, the terms "layer" and "film" mean and include a level, sheet, or coating of material residing on a structure, which level, sheet, or coating may be continuous or discontinuous between portions of the material, may be planar or non-planar, and may be conformal or non-conformal, unless otherwise indicated.

As used herein, the term "sacrificial," when referring to a material, region, structure, or component, means and includes the material, region, structure, or component being of a preliminary or intermediary stage in a fabrication process and intended for removal, in whole or in substantial part, prior to completion of the fabrication process.

As used herein, the terms "lateral" or "horizontal" mean and include a direction that is parallel to a primary surface or plane over which the referenced material or structure is located. The width and length of a respective region or material may be defined as dimensions in a horizontal plane.

As used herein, the terms "longitudinal" or "vertical" mean and include a direction that is perpendicular to a primary surface or plane over which a referenced material or structure is located. The height of a respective region or material may be defined as a dimension in a vertical plane.

As used herein, the terms "thickness," "thinness," or "height" mean and include a dimension in a straight-line direction that is normal to a plane of the closest surface of an immediately adjacent material or region of different composition.

As used herein, the term "between" is a spatially relative term used to describe the relative disposition of one material, region, or sub-region relative to at least two other materials, regions, or sub-regions. The term "between" may encompass both a disposition of one material, region, or sub-region directly adjacent to the other materials, regions, or sub-regions and a disposition of one material, region, or sub-region indirectly adjacent to the other materials, regions, or sub-regions.

As used herein, the term "proximate" is a spatially relative term used to describe disposition of one material, region, or sub-region near to another material, region, or sub-region. The term "proximate" includes dispositions of indirectly adjacent to, directly adjacent to, and internal to.

As used herein, the term "neighboring," when referring to a material or region, means and refers to a next, most proximate material or region of an identified composition. Materials or regions of other compositions than the identified composition may be disposed between one material or region and its "neighboring" material or region of the identified composition. For example, a region of passivation material "neighboring" a region of conductive material is the passivation material region, e.g., of a plurality of passivation material regions, that is next most proximate to the particular region of conductive material. The "neighboring" material or region may be directly or indirectly proximate the region or material of the identified composition.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0% met, at least 95.0% met, at least 99.0% met, or even at least 99.9% met.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "comprises," "comprising," "includes," and/or "including" specify the presence of stated features, regions, stages, operations, elements, materials, components, and/or groups, but do not preclude the presence or addition of one or more other features, regions, stages, operations, elements, materials, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

As used herein, the terms "configured" and "configuration" mean and refer to a size, shape, material composition, orientation, and arrangement of a referenced material, structure, assembly, or apparatus so as to facilitate a referenced operation or property of the referenced material, structure, assembly or apparatus in a predetermined way.

The illustrations presented herein are not meant to be actual views of any particular structure, component, device, or system, but are merely idealized representations that are employed to describe embodiments of the disclosure.

The following description provides specific details—such as material types, material thicknesses, and processing conditions—in order to provide a thorough description of embodiments of the disclosed films, assemblies, systems, and methods. However, a person of ordinary skill in the art will understand that the embodiments of the films, assemblies, systems, and methods may be practiced without employing these specific details. Indeed, the embodiments of the films, assemblies, systems, and methods may be practiced in conjunction with conventional semiconductor fabrication techniques employed in the industry.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization (e.g., grinding or chemical mechanical planarization (CMP)), or other known methods.

The fabrication processes described herein do not form a complete process flow for processing semiconductor device structures. The remainder of the process flow, whether stages preceding or following those described, is known to those of ordinary skill in the art. Accordingly, only the methods and semiconductor device structures necessary to understand embodiments of the present structures, films, assemblies, systems, and methods are described herein.

Reference will now be made to the drawings, where like numerals refer to like components throughout. The drawings are not necessarily drawn to scale.

Figure 1:
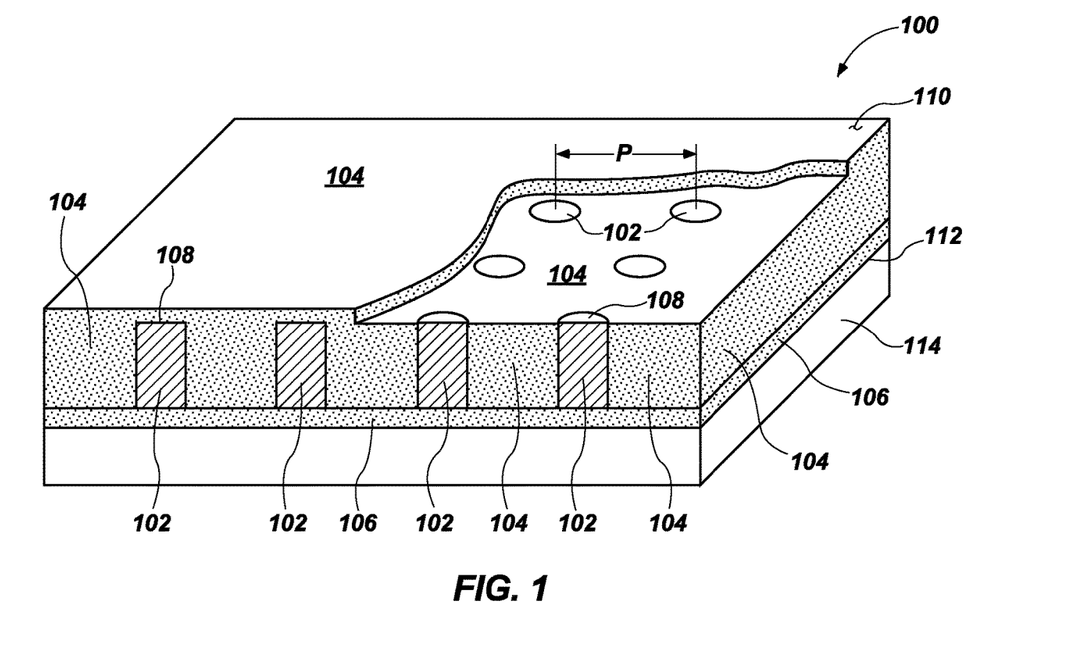
FIG. 1 is a front and top perspective, cross-sectional, and partial cut-away, schematic illustration of an anisotropic conductive film according to an embodiment of the disclosure.

FIG. 1 illustrates an anisotropic conductive film (ACF) 100 according to an embodiment of the disclosure. The ACF 100 includes discrete conductive regions 102 comprising a conductive, carbon-based material having low resistivity and high conductivity. The discrete conductive regions 102 may be embedded within adhesive dielectric material, which may include a first adhesive dielectric material 104 laterally adjacent the discrete conductive regions 102 and a second adhesive dielectric material 106 below the discrete conductive regions 102. In some embodiments, the first adhesive dielectric material 104 may also extend above and over the discrete conductive regions 102, covering an upper surface 108 of each of the discrete conductive regions 102.

The adhesive dielectric material (e.g., the first adhesive dielectric material 104 and the second adhesive dielectric material 106) may comprise a polymer, such as an epoxy resin material, an acrylic resin, a phenol-aldehyde resin, a hydroxyl polyester resin, a hydroxyl acrylic acid resin, or a silicone material. The first adhesive dielectric material 104 defines an upper surface 110 of the ACF 100. The second adhesive dielectric material 106 defines a lower surface 112 of the ACF 100. Thus, the ACF 100 may be characterized as a type of two-sided adhesive tape, and each of the upper surface 110 and the lower surface 112 of the ACF 100 may be adherable to a semiconductor die or a substrate to enable electrical and mechanical connection between the adhered dice (or die and substrate).

Prior to use of the ACF 100 to adjoin vertically adjacent semiconductor dice (or a semiconductor die and a substrate), the adhesive dielectric material may be kept covered. For example, the lower surface 112 of the ACF 100 may be initially supported by a base material 114, such as glass, stainless steel, or another solid material removable from the second adhesive dielectric material 106. The upper surface 110 of the ACF 100 may also be initially covered by a removable material (not shown), such as a flexible polymer material, formulated to release from the first adhesive dielectric material 104 and be peeled away from the upper surface 110 of the ACF 100 prior to the use of the ACF 100. The ACF 100 may be extremely thin, on the order of less than about 4000 Å (less than about 0.4 µm), such that a covering material around the sidewalls of the ACF 100 may not be required to ensure adequate pre-use protection of the adhesive dielectric material (e.g., the first adhesive dielectric material 104 and the second adhesive dielectric material 106). Furthermore, it is contemplated that the ACF will be fabricated in the form of a large sheet or film to be singulated into segments corresponding in length and width to components (e.g., semiconductor dice) to which the ACF is to be adhered. Such singulation may take place before adherence. Alternatively, streets with no discrete conductive regions 102 may be left between segments, and the ACF may be singulated after a large number of laterally spaced, stacked semiconductor die assemblies are fabricated.

The discrete conductive regions 102 within the adhesive dielectric material of the ACF 100 are arranged in a pattern to provide an array of the discrete conductive regions 102, spaced center-to-center in at least one lateral direction by a desired "pitch" P. In some instances, the pitch P between adjacent discrete conductive regions 102 may be uniform. In other instances, the pitch P may be of one magnitude in a first direction and of another, different magnitude in another, perpendicular direction. The pitch P may be very small (e.g., less than about 2 µm; between about 1 µm and about 2 µm), but at least great enough for the adhesive dielectric material to provide sufficient electrical isolation between neighboring regions of the discrete conductive regions 102. The small pitch P may be enabled by use of the carbon-based material, exhibiting the very low electric resistivity, as the primary material of the discrete conductive regions 102.

Figure 2:
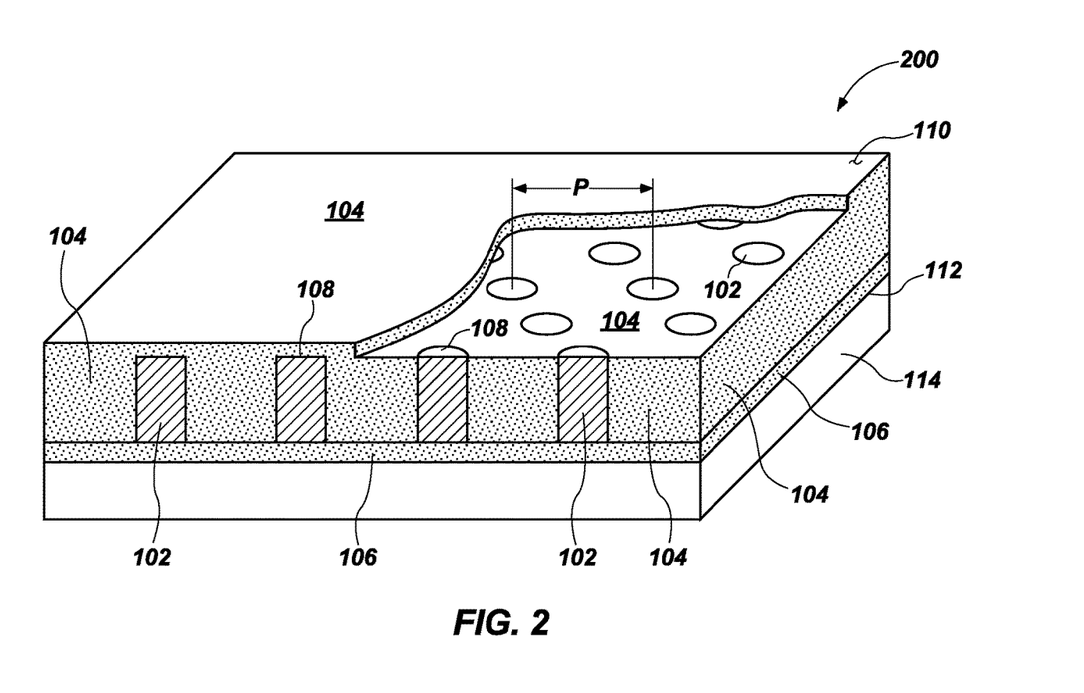
FIG. 2 is a front and top perspective, cross-sectional, and partial cut-away, schematic illustration of an anisotropic conductive film according to an embodiment of the disclosure.

In some embodiments, such as that illustrated in FIG. 1, the array of discrete conductive regions 102 may be arranged in a pattern of rows and columns, wherein each interior discrete conductive region 102 is arranged in a straight line with two neighboring discrete conductive regions 102 in each of its mutually perpendicular row and column. In other embodiments, such as that illustrated in FIG. 2, an ACF 200 may include an array of the discrete conductive regions 102 arranged in a pattern of offset rows and columns. Nonetheless, the ACFs 100 (FIG. 1), 200 (FIG. 2) each include an array of the discrete conductive regions 102, comprising the carbon-based material, and embedded in the adhesive dielectric material (e.g., the first adhesive dielectric material 104 and the second adhesive dielectric material 106). Also contemplated are other patterns of the discrete conductive regions 102, based on arrangements of conductive elements of semiconductor dice, interposers, and carrier substrates to be mutually joined.

Accordingly, disclosed is an anisotropic conductive film comprising a pattern of discrete regions mutually laterally spaced by at least one predetermined pitch. Each discrete region comprises a conductive carbon-based material. The anisotropic conductive film also comprises a dielectric material at least between the discrete regions.

Figure 3A:
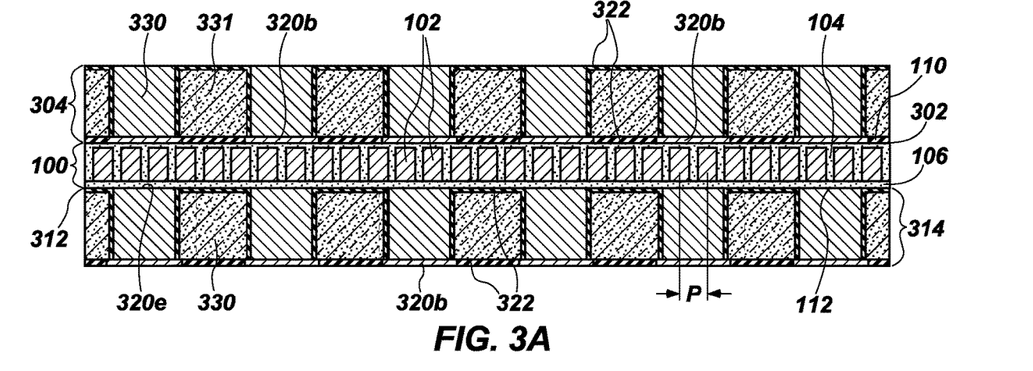
FIG. 3A is a cross-sectional, elevational, schematic illustration of a semiconductor assembly, according to an embodiment of the disclosure, with an anisotropic conductive film in a pre-compressed configuration.
Figure 3B:
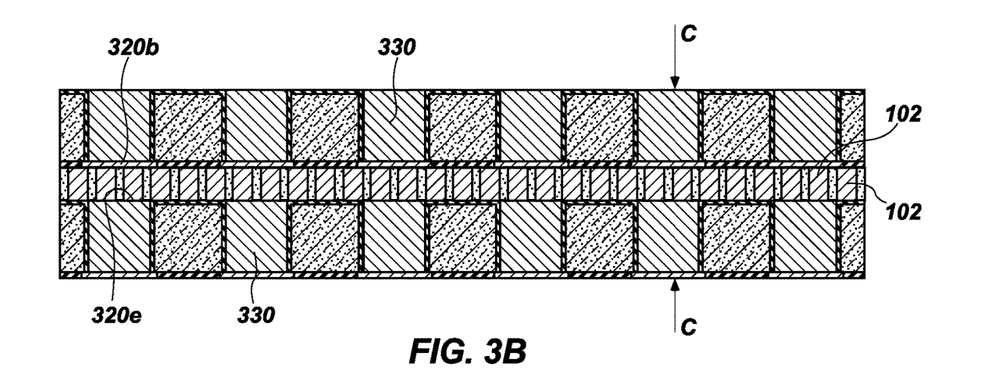
FIG. 3B is a cross-sectional, elevational, schematic illustration of the semiconductor assembly of FIG. 3A, with the anisotropic conductive film in a compressed configuration.

With reference to FIG. 3A and FIG. 3B, and taking the ACF 100 of FIG. 1 as an example, the ACF 100 may be used to electrically and mechanically connect conductive elements of separate semiconductor dice, forming an example semiconductor assembly. To use the ACF 100, the adhesive dielectric material (e.g., the first adhesive dielectric material 104) at the upper surface 110 of the ACF 100 may be exposed (e.g., by removing any upper covering), and the upper surface 110 adhered to a surface 302 (e.g., an active surface) of a semiconductor die 304. The adhesive nature of the first adhesive dielectric material 104 may be sufficient to enable mechanical joining of the ACF 100 to the semiconductor die 304. The adhesive dielectric material (e.g., the second adhesive dielectric material 106) at the lower surface 112 of the ACF 100 may be exposed (e.g., by removing the base material 114), and the lower surface 112 adhered to a surface 312 (e.g., a back-side surface) of another semiconductor die 314 (or to a substrate). Again, the adhesive nature of the second adhesive dielectric material 106 may be sufficient to enable mechanical joining of the ACF 100 to the other semiconductor die 314.

Each of the surfaces 302, 312 may include, and have exposed thereon, conductive elements 320 (e.g., bond pads 320b, end pads 320e of TSVs 330, etc.) laterally spaced from neighboring conductive elements 320 and having an optional dielectric material 322 (e.g., a passivation material) surrounding and between conductive elements 320. As used herein, reference number "320" refers, generally, to either or both of the more particularized "320b" and/or "320e" features identified in the figures.

Each of semiconductor die 304 and semiconductor die 314 may, as is conventional, comprise a silicon die of about 40 µm to about 70 µm thickness, having been thinned—from an initial wafer of about 700 µm to about 750 µm thickness—by removal of material from a back side thereof by one or more of back grinding, chemical mechanical planarization (CMP), and etching. Each of semiconductor die 304 and semiconductor die 314 may, optionally, include conductive TSVs 330 extending from the conductive elements 320 in the form of the bond pads 320b on an active surface (e.g., a lower surface of the semiconductor die 304 (e.g., surface 302), a lower surface of the semiconductor die 314) to the end pads 320e exposed on a back side surface (e.g., an upper surface of the semiconductor die 304, an upper surface (e.g., surface 312) of the semiconductor die 314). Segments of semiconductor material 331 and additional dielectric material 322 may be disposed between neighboring TSVs 330.

When the semiconductor dice 304, 314 and the ACF 100 of the semiconductor assembly (FIG. 3A) are initially joined, the discrete conductive regions 102 of the ACF 100 may be isolated, as illustrated in FIG. 3A, from physical contact with the surfaces 302, 312 by the intervening adhesive dielectric material of the ACF 100, e.g., the first adhesive dielectric material 104 above the discrete conductive regions 102 and the second adhesive dielectric material 106 below the discrete conductive regions 102.

To bring the discrete conductive regions 102 into physical contact with the conductive elements 320 of the semiconductor dice 304, 314, the semiconductor assembly (FIG. 3A) may be compressed, e.g., from above and/or below in the direction of arrows C of FIG. 3B. This vertical compression may squeeze away the first adhesive dielectric material 104 laterally from above the discrete conductive regions 102 and may squeeze away the second adhesive dielectric material 106 laterally from below the discrete conductive regions 102, compressing the first and second adhesive dielectric materials 104, 106. Depending upon the composition of the first and second adhesive dielectric materials 104, 106, heat may be applied during such compression to cure the first and second adhesive dielectric materials 104, 106. The resulting semiconductor assembly (illustrated in FIG. 3B) includes at least some of the conductive elements 320 (e.g., the bond pads 320b, the end pads 320e) of the semiconductor dice 304, 314 in direct physical contact with one or more of the discrete conductive regions 102 of the ACF 100. Where a conductive element 320 of the semiconductor die 304 is in physical contact with the same discrete conductive region (or regions) 102 of the ACF 100 as another conductive element 320 of the other semiconductor die 314, the two conductive elements 320 are effectively in electrical connection enabled by the electrical conductivity of the material (e.g., the conductive carbon-based material) of the discrete conductive regions 102 and maintained in contact by the adhesion of the compressed (and optionally cured) adhesive dielectric materials 104, 106 of the ACF 100.

Notably, the ACF 100 functions to mechanically and electrically interconnect the conductive elements 320 of the semiconductor dice 304, 314 without requiring precise alignment of the discrete conductive regions 102 of the ACF 100 with particular conductive elements 320 and without requiring precise alignment of the conductive elements 320 of the respective semiconductor dice 304, 314. The laterally disposed adhesive dielectric material (e.g., the now-compressed first adhesive dielectric material 104 and second adhesive dielectric material 106) and the (optional) dielectric material 322 ensures sufficient electrical insulation to prohibit unwanted current leakage between neighboring discrete conductive regions 102 and between neighboring conductive elements 320.

Use of an ACF configured in accordance with embodiments of the disclosure (e.g., the ACF 100 of FIG. 1, the ACF 200 of FIG. 2) provides significant advantages in comparison to conventional techniques employed in fabricating stacked die assemblies. For example, the disclosed embodiments eliminate the formation of such conductive elements as copper pillars, optionally topped with a solder cap and with a nickel barrier layer between the copper and the solder. In addition, use of the ACF of embodiments herein eliminates the requirement for an underfill material, such as a capillary underfill or an NCF between vertically superimposed dice. Thermal budgets of the semiconductor dice being joined are also conserved, as reflow heating of solder is eliminated, as is a thermocompression process to diffusion-bond copper pillars to end pads of TSVs or to other conductive elements. If appropriate adhesive dielectric materials are selected, heat-induced cure of such material or materials is eliminated. Further, the use of carbon-based materials at extremely fine pitches likewise accommodates the implementation of finer-pitched conductive elements, such as bond pads and TSVs, as circuits and dice shrink while maintaining electrical conductivity facilitated by the low resistivity of such materials for power, ground/bias, and ever-faster data signals. In addition, speed of fabrication of die stacks is significantly enhanced, whether individual ACF segments are placed between individual semiconductor dice being stacked or whether die stack fabrication is conducted on a wafer scale using a wafer-sized array of ACF segments laterally separated by streets and placed between wafers of previously-singulated dice reconstituted as a wafer-sized array in a matrix material separating the dice from one another by streets corresponding to the ACF streets.

It should be recognized that, depending on the pitch P at which the discrete conductive regions 102 were formed in the ACF 100, and the lateral separation and dimensions of the conductive elements 320 and the dielectric material 322, not every discrete conductive region 102 may be brought into physical contact with one of the conductive elements 320. Likewise, more than one discrete conductive region 102 may be, and generally is, brought into physical contact with an opposing pair of the conductive elements 320. As discussed above, the pitch P may be selected and configured to enable sufficient electrical connection between the discrete conductive regions 102 and the conductive elements 320.

Because the discrete conductive regions 102 may be formed primarily (i.e., at a content of at least fifty at. %) of conductive carbon-based material having very low resistivity (and, therefore, high electrical conductivity), the ACF 100 may provide sufficient electrical connection without lateral shorting, even with the discrete conductive regions 102 formed at very small, controlled, predetermined pitch. In contrast, to achieve the same level of electrical conductivity in conventional ACF structures employing metal conductive elements, larger regions or relatively large particles of conductive material may be required to provide adequate electrical conductivity without excessive resistance. In addition, conventional ACF structures require larger effective pitches—to avoid a risk of lateral shorting—compared to the ACF embodiments of the disclosure.

Figure 4:
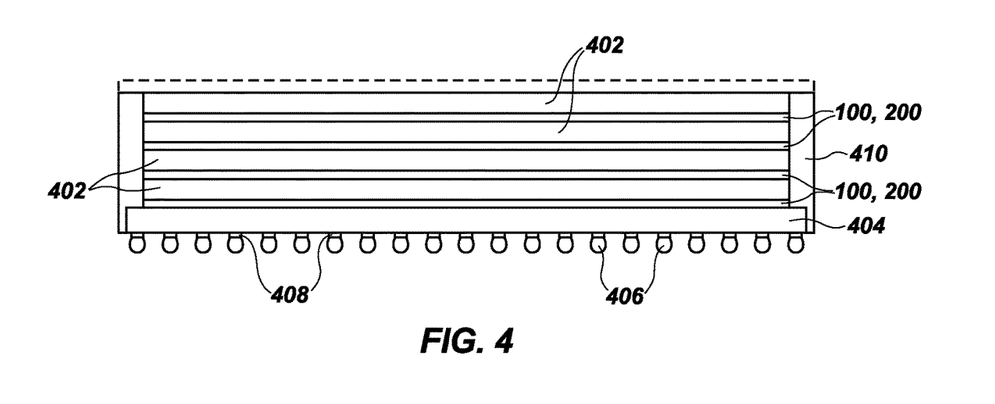
FIG. 4 is an elevational, schematic illustration of an example semiconductor device package implementing anisotropic conductive films according to embodiments of the disclosure.

Referring now to FIG. 4, an example semiconductor device package comprises multiple (e.g., four) memory dice 402 (e.g., in the form of DRAM) stacked on a logic die 404. All but an uppermost die of the memory dice 402 are TSV-enabled, as is the logic die 404. As with the semiconductor dice 304, 314 illustrated in FIGS. 3A and 3B, TSVs (e.g., the TSVs 330) extend from bond pads (e.g., the bond pads 320b) on active surfaces of the semiconductor dice (e.g., the semiconductor dice 304, 314), so equipped, to terminal surfaces in the form of end pads (e.g., the end pads 320e) on back sides of those dice. An ACF (e.g., the ACF 100 of FIG. 1, the ACF 200 of FIG. 2), comprising discrete conductive regions (e.g., the discrete conductive regions 102) of carbon-based material in a matrix of adhesive dielectric material (e.g., the first and second adhesive dielectric materials 104, 106), is located between each of the semiconductor dice 402, 404 of the semiconductor device package (FIG. 4). External conductive elements 406 in the form of solder balls or bumps, for connection to higher-level packaging, may be located on under bump metallization (UBM) 408 on the logic die 404 opposite the stack of the memory dice 402. A dielectric encapsulant, in the form of a molding compound 410, may surround the lateral periphery of the stacked dice 402, 404 and, optionally, the upper surface of the uppermost memory die of the memory dice 402, as shown in broken lines. As an alternative, if the upper surface of the stack of the memory dice 402 is exposed, the upper surface may be in thermal contact with a heat sink (not shown) through a thermal interface material (not shown).

Accordingly, disclosed is a semiconductor device assembly, comprising a semiconductor die and another semiconductor die. The semiconductor die comprises a pattern of conductive elements, and the other semiconductor die comprises a same pattern of conductive elements superimposed on the semiconductor die with the patterns aligned. An anisotropic conductive film is between the semiconductor die and the other semiconductor die. The anisotropic conductive film comprises an array of mutually discrete regions of conductive material in a film of at least one dielectric material. The mutually discrete regions are separated by at least one predetermined pitch. The conductive material comprises primarily a carbon-based material.

In addition, disclosed is a method for forming a semiconductor assembly. The method comprise adhering, above a surface of a semiconductor die, an anisotropic conductive film comprising an arrangement pattern of discrete conductive regions embedded in an adhesive dielectric material. The discrete conductive regions comprise a carbon-based material. The method also comprises adhering, above the anisotropic conductive film, a surface of another semiconductor die. The method also comprises compressing the anisotropic conductive film between the semiconductor die and the other semiconductor die to displace at least some of the adhesive dielectric material and directly contact at least some of the discrete conductive regions with conductive elements of each of the semiconductor die and the other semiconductor die.

With reference to FIGS. 5 through 10, illustrated are various structural embodiments for the discrete conductive regions 102 of any of the ACFs (e.g., ACF 100 of FIGS. 1, 3, and 4; ACF 200 of FIG. 2) of the disclosure. In any of FIGS. 5 through 10, the discrete conductive regions 102 are formed primarily (i.e., at a content of at least fifty at. %) of a conductive carbon-based material 502. In some of these embodiments, the discrete conductive regions 102 may further include another conductive material, such as a seed material 504.

In some embodiments, the conductive carbon-based material 502 may consist essentially of or consist of graphene, 100% pure carbon, exhibiting an electrical resistivity of about $10^{-6}$ Ω·cm. This low electrical resistivity may be exhibited regardless of the width or thickness of the conductive carbon-based material 502.

If present, the seed material 504 may comprise, consist essentially of, or consist of any of copper (Cu), nickel (Ni), a bi-layer of copper (Cu) and nickel (Ni), or another conductive material formulated for growth of the conductive carbon-based material 502 (e.g., the graphene) thereon.

In some embodiments, the discrete conductive regions 102 may be free from chemical elements such as aluminum (Al), silver (Ag), tin (Sn), more than one of these, or all of these.

Figures 5, 6, 7, 8, 9:
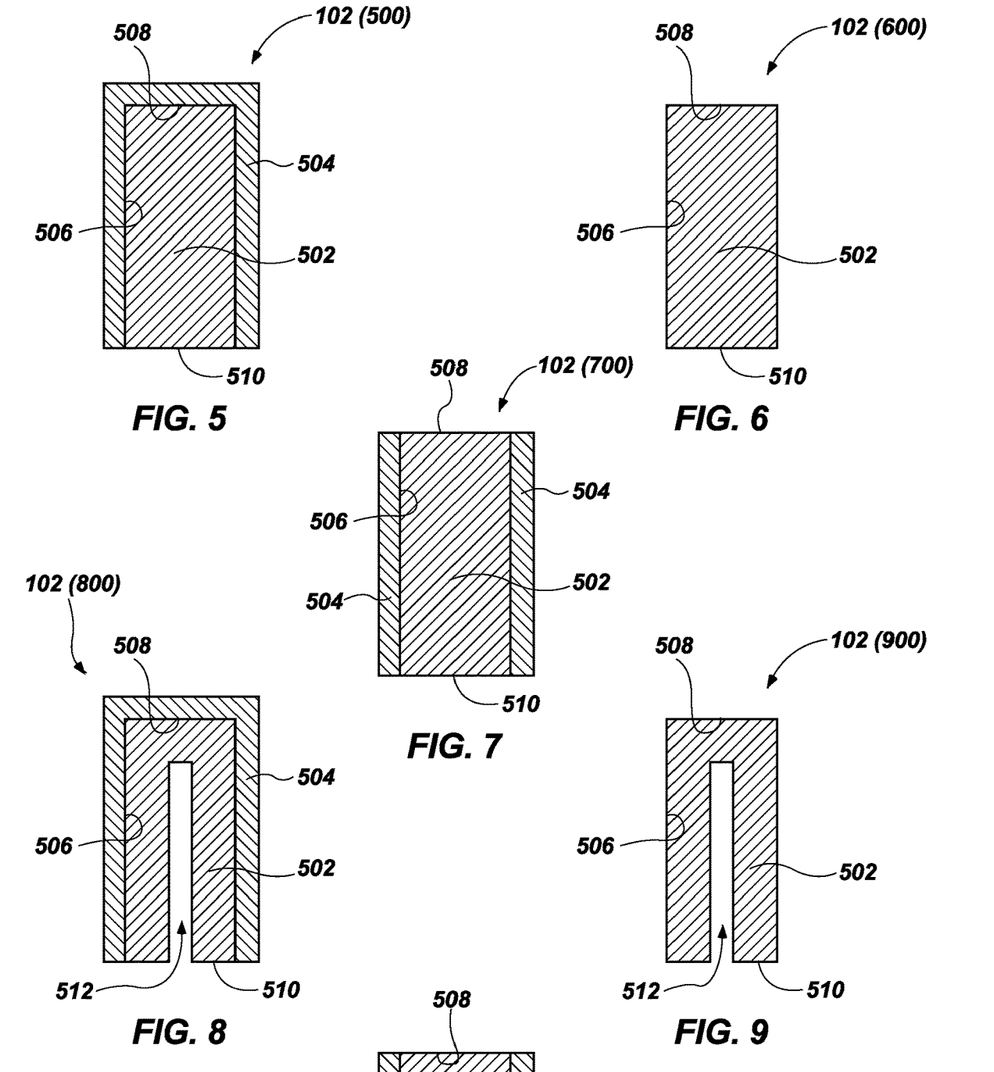
FIG. 5 is an elevational, schematic illustration of a carbon-based conductive region of any of the anisotropic conductive films of FIGS. 1 through 4, according to an embodiment of the disclosure, wherein the carbon-based conductive region includes a seed material along a sidewall and upper surface.
FIG. 6 is an elevational, schematic illustration of a carbon-based conductive region of any of the anisotropic conductive films of FIGS. 1 through 4, according to an embodiment of the disclosure, wherein the carbon-based conductive region consists of a carbon-based material.
FIG. 7 is an elevational, schematic illustration of a carbon-based conductive region of any of the anisotropic conductive films of FIGS. 1 through 4, according to an embodiment of the disclosure, wherein the carbon-based conductive region includes a seed material along a sidewall.
FIG. 8 is an elevational, schematic illustration of a carbon-based conductive region of any of the anisotropic conductive films of FIGS. 1 through 4, according to an embodiment of the disclosure, wherein the carbon-based conductive region includes a seed material along a sidewall and upper surface and also defines an internal void.
FIG. 9 is an elevational, schematic illustration of a carbon-based conductive region of any of the anisotropic conductive films of FIGS. 1 through 4, according to an embodiment of the disclosure, wherein the carbon-based conductive region consists of a carbon-based material and also defines an internal void.

With reference to FIG. 5, specifically, the discrete conductive region 102 of the illustrated embodiment may have a structure 500 that includes the conductive carbon-based material 502 as a central portion, with the seed material 504 covering a sidewall 506 and an upper surface 508 of the conductive carbon-based material 502. With this structure 500 for the discrete conductive region 102 in the ACF 100

(or ACF 200), the first adhesive dielectric material 104 may be in direct contact with the seed material 504, while the second adhesive dielectric material 106 may be the only adhesive dielectric material in direct contact with the conductive carbon-based material 502. Therefore, in the final semiconductor device package of FIG. 4, the seed material 504 may be in direct physical contact with a corresponding one of the conductive elements 320 of the semiconductor die 304 (proximate the upper surface 508) as well as with a corresponding one of the conductive elements 320 of the other semiconductor die 314 (proximate a lower surface 510 of the conductive carbon-based material 502), while the conductive carbon-based material 502 may be in direct physical contact with the corresponding one of the conductive elements 320 of the other semiconductor die 314 (at the lower surface 510).

With reference to FIG. 6, the discrete conductive region 102 of the illustrated embodiment may have a structure 600 that consists essentially of, or consist of, the conductive carbon-based material 502 as a unitary, solid whole region. (As used in this description, "solid" refers to a lack of substantial void space.) With this structure 600 for the discrete conductive region 102 in the ACF 100 (or ACF 200), the first adhesive dielectric material 104 may be in direct contact with the conductive carbon-based material 502 along the sidewall 506 and the upper surface 508, and the second adhesive dielectric material 106 may be in direct contact with the conductive carbon-based material 502 along the lower surface 510. Therefore, in the final semiconductor device package of FIG. 4, a corresponding pair of the conductive elements 320 may be in direct physical contact with the conductive carbon-based material 502.

With reference to FIG. 7, the discrete conductive region 102 of the illustrated embodiment may have a structure 700 that includes the conductive carbon-based material 502 as a central portion, with the seed material 504 covering the sidewall 506 only. With this structure 700 for the discrete conductive region 102 in the ACF 100 (or ACF 200), the first adhesive dielectric material 104 may be in direct contact with the seed material 504 at the sidewall 506 and with the conductive carbon-based material 502 and with an edge of the seed material 504 at the upper surface 508, while the second adhesive dielectric material 106 may be in direct contact with the conductive carbon-based material 502 and with an edge of the seed material 504 at the lower surface 510. Therefore, in the final semiconductor device package of FIG. 4, the seed material 504 and the conductive carbon-based material 502 may each be in direct physical contact with conductive elements 320.

Figure 10:
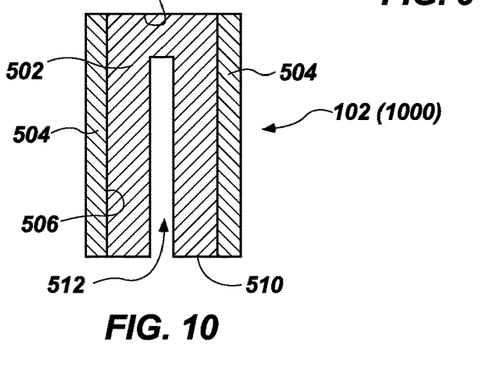
FIG. 10 is an elevational, schematic illustration of a carbon-based conductive region of any of the anisotropic conductive films of FIGS. 1 through 4, according to an embodiment of the disclosure, wherein the carbon-based conductive region includes a seed material along a sidewall and also defines an internal void.

With reference to FIGS. 8 through 10, the discrete conductive region 102 may include a void space 512 defined by the conductive carbon-based material 502. Nonetheless, the discrete conductive regions 102 may exhibit sufficient, high electrical conductivity to enable electrical connection between adjoined conductive elements 320. That is, in some embodiments, the inclusion of the void space 512 in the conductive carbon-based material 502 may not be deleterious to the performance of the ACF.

The void space 512 may be located in a central portion of the discrete conductive region 102 and lined by the conductive carbon-based material 502. Aside from the void space 512, a structure 800 of the discrete conductive region 102 of FIG. 8 is the same as that described for the structure 500 of FIG. 5; a structure 900 of the discrete conductive region 102 of FIG. 9 is the same as that described for the structure 600 of FIG. 6; and a structure 1000 of the discrete conductive region 102 of FIG. 10 is the same as that described for the structure 700 of FIG. 7.

The discrete conductive regions 102 of FIGS. 5 through 10 may define an extremely small vertical height. For example, the discrete conductive regions 102 (or, alternatively, the conductive carbon-based material 502 portion thereof) may define a height of less than about 2000 Å (less than about 0.2 µm) (e.g., less than about 1000 Å (less than about 0.1 µm), less than about 500 Å (less than about 0.05 µm)). Therefore, the ACF 100 of FIG. 1 (or ACF 200 of FIG. 2) may be thin, e.g., less than about 4000 Å (less than about 0.4 µm). In some embodiments, each of the discrete conductive regions 102 extends through a majority of the height of the ACF 100.

Figure 11:
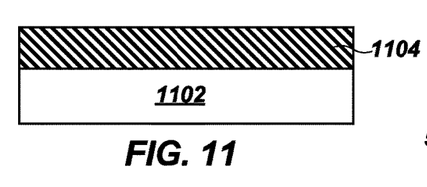
FIGS. 11 through 20 are cross-sectional, elevational, schematic illustrations during various stages of processing to fabricate the anisotropic conductive film of any of FIGS. 1 through 4, according to the structural embodiment of the carbon-based conductive region of FIG. 5 and according to a method embodiment of the disclosure.

With reference to FIGS. 11 through 20, illustrated are stages of a method of fabricating an ACF (e.g., the ACF 100 of FIG. 1 or the ACF of FIG. 2) with the discrete conductive regions 102 thereof having the structure 500 of the embodiment of FIG. 5. With reference to FIG. 11, a sacrificial base material 1102 (e.g., silicon or another material capable of providing a supportive surface and being later removable) may support a dielectric material 1104 (e.g., silicon dioxide ($SiO_2$), silicon nitride ($Si_3N_4$), silicon carbonitride (SiCN), silicon-carbon-oxygen (SiCO)). The dielectric material 1104 may be formulated to retain its structural integrity at high temperatures, e.g., temperatures exceeding 800° C. (e.g., temperatures of about 1000° C. or greater). The dielectric material 1104 may be formed on the base material 1102 by, for example, CVD, PVD, spin coating with thermal cure, or other dielectric deposition process known in the art. In some embodiments, the dielectric material 1104 may be formed to define a thickness (e.g., a vertical height) on the sacrificial base material 1102 that is about or equal to the desired final height of the discrete conductive regions 102 (FIG. 1) to be formed.

Figure 12:
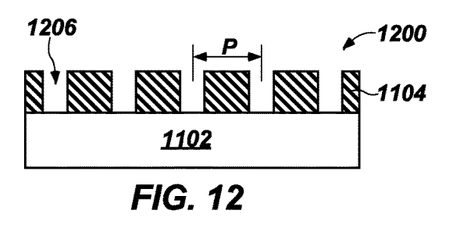

With reference to FIG. 12, the dielectric material 1104 may be patterned (e.g., by photolithography followed by etching) at pitch P to form a structure 1200 with openings 1206 defining the desired, ordered arrangement of the discrete conductive regions 102 (FIG. 1 or FIG. 2) to be formed. The openings 1206 may expose areas of the base material 1102.

Figure 13:
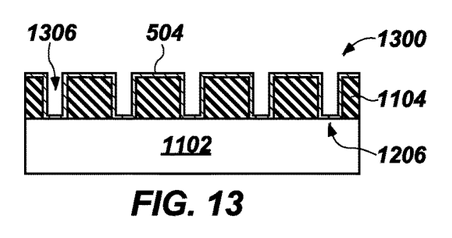

With reference to FIG. 13, the seed material 504 may then be formed, conformally, within the openings 1206, forming a structure 1300 with narrower openings 1306 lined by the seed material 504. The seed material 504 may be formed by, for example, PVD, CVD, electroless plating, electro-plating, or a combination thereof. In some embodiments, the seed material 504 may be formed to wholly cover the structure 1200 (FIG. 12), extending over the exposed surface of the dielectric material 1104.

Figure 14:
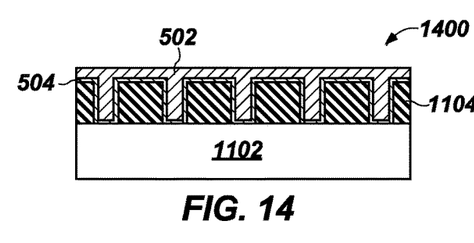

The conductive carbon-based material 502 may then be conformally formed (e.g., by microwave plasma CVD (MPCVD), or by low pressure CVD (LPCVD)) within the narrower openings 1306 to form a structure 1400 of FIG. 14. In some embodiments, such as that illustrated in FIG. 14, the conductive carbon-based material 502 may be formed to completely fill the narrower openings 1306 (FIG. 13) and to overlay the whole of the structure 1300 (FIG. 13).

The conductive carbon-based material 502 may be formed at high temperatures (e.g., at least about 800° C. (e.g., exceeding about 1000° C.)). Because the dielectric material 1104 is formulated to withstand high temperatures, formation of the conductive carbon-based material 502 may not deteriorate any previously-formed materials of the structure.

Figure 15:
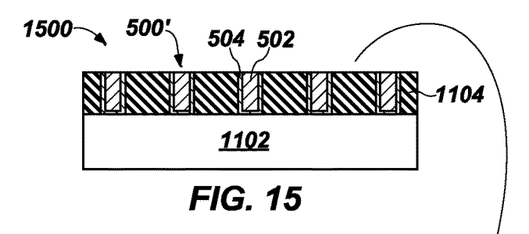

With reference to FIG. 15, the regions of the conductive material of the discrete conductive regions 102 (e.g., FIGS. 5 through 10) to be formed may then be isolated from one another, forming precursor structure 1500, by removing portions of the conductive carbon-based material 502 and the seed material 504 previously extending over the surface of the dielectric material 1104. These portions may be removed by, for example, planarization (e.g., chemical mechanical planarization (CMP)) or etching, leaving the dielectric material 1104 exposed between neighboring discrete regions of the conductive carbon-based material 502 and the seed material 504. It should be recognized that these formed discrete regions are the previously-described structures 500 of FIG. 5 for the discrete conductive regions 102 (FIG. 5), but inverted (i.e., inverted structures 500').

Figure 16:
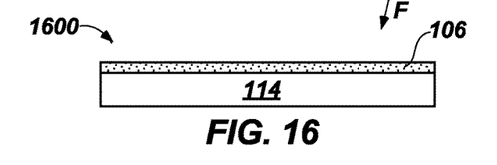
Figure 17:
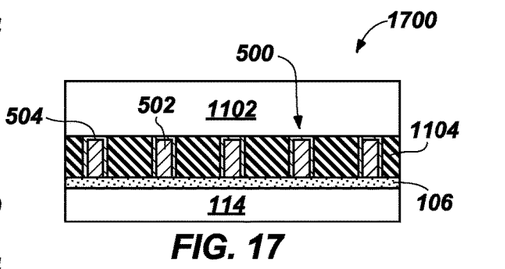

The precursor structure 1500 supporting the inverted structures 500' for the discrete conductive regions 102 (FIG. 5) may then be flipped (e.g., inverted), as indicated by arrow F, and joined to a structure 1600, illustrated in FIG. 16, having adhesive dielectric material (e.g., the second adhesive dielectric material 106) on the base material 114, forming joined structure 1700 of FIG. 17. Thus, the conductive carbon-based material 502 of the precursor structure 1500 with the sacrificial base material 1102 may be formed at high temperatures without the high-temperature processes deteriorating the properties of the adhesive dielectric material (e.g., the second adhesive dielectric material 106), which is formed separately (e.g., by deposition), on a different support structure (e.g., the base material 114). The adhesive dielectric material (e.g., the second adhesive dielectric material 106) may be formed on the base material 114 before, while, or after forming the precursor structure 1500 of FIG. 15.

Figure 18:
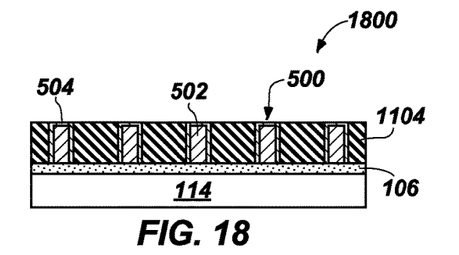

From the joined structure 1700, the sacrificial base material 1102 may then be removed (e.g., by etching (e.g., wet etching, dry etching), by CMP), leaving structure 1800 of FIG. 18 with the structures 500 for the discrete conductive regions 102 (FIG. 5) in upright configuration.

Figure 19:
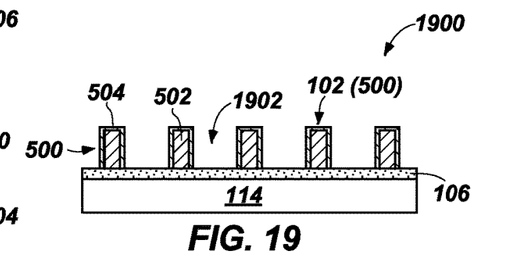

The dielectric material 1104 may then be removed (e.g., by etching (e.g., wet etching, vapor-phase etching, dry etching)), forming a structure 1900 of FIG. 19 with an open volume 1902 surrounding and defined between the structures 500 of the discrete conductive regions 102. The open volume 1902 may expose regions of the adhesive dielectric material (e.g., the second adhesive dielectric material 106) between the structures 500. In some embodiments, the seed material 504 may continue to wholly cover the conductive carbon-based material 502, but for the portions under which the second adhesive dielectric material 106 lies, at this stage in the fabrication process.

Figure 20:
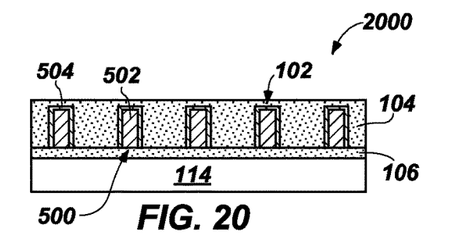

With reference to FIG. 20, the remaining amount of the adhesive dielectric material (e.g., the first adhesive dielectric material 104) may then be formed in the open volume 1902 (FIG. 19) and over the structures 500 of the discrete conductive regions 102, forming ACF 2000.

Accordingly, by the described method embodiment, formed is the ACF 2000 comprising discrete conductive regions 102 each comprising a solid sub-region of the conductive carbon-based material 502 and the seed material 504 in direct contact with the sidewall 506 (FIG. 5) and the upper surface 508 (FIG. 5) of the conductive carbon-based material 502 and also comprising two regions of adhesive dielectric material: a region of the first adhesive dielectric material 104 laterally adjacent and above the discrete conductive regions 102 and a region of the second adhesive dielectric material 106 below the discrete conductive regions 102. The ACF 2000 may then be used in the manner described above with regard to FIGS. 3 and 4.

Accordingly, disclosed is a method for forming an anisotropic conductive film. The method comprises forming a precursor structure. Forming the precursor structure comprises forming, on a sacrificial base material, a dielectric material. Discrete openings are defined in the dielectric material. A seed material is formed in the discrete openings. A carbon-based material is formed on the seed material. In addition to forming a precursor structure, another structure is formed, the other structure comprising an adhesive material on another base material. The precursor structure is joined, on a surface thereof opposite the sacrificial base material, to the other structure. The sacrificial base material and the dielectric material are removed to form additional openings. Additional adhesive material is formed in the additional openings to electrically insulate the carbon-based material.

Figure 21:
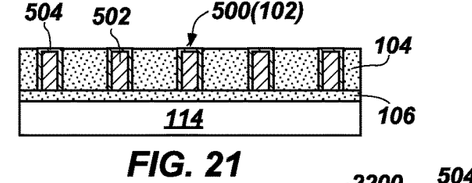
FIGS. 21 and 22, in conjunction with FIGS. 1 through 19, are cross-sectional, elevational, schematic illustrations during various stages of processing to fabricate an anisotropic conductive film, according to a structural embodiment of the film and according to a method embodiment of the disclosure.

In other method embodiments of the disclosure, the adhesive dielectric material of the ACF (e.g., the ACF 100 (FIGS. 1, 3, and 4), the ACF 200 (FIG. 2)) may be formed in more than two regions. For example, after the method stage of FIG. 19, described above, the first adhesive dielectric material 104 may be formed to fill the open volume 1902 (FIG. 19) without also covering the structures 500 of the discrete conductive regions 102, as illustrated in FIG. 21. Then, with reference to FIG. 22, a third adhesive dielectric material 2208 may be formed above the structures 500 of the discrete conductive regions 102. The third adhesive dielectric material 2208 may be selected from any of the aforementioned adhesive dielectric materials for the first adhesive dielectric material 104 and the second adhesive dielectric material 106, and it may be a same or a different adhesive dielectric material from that of the first and second adhesive dielectric materials 104, 106. In some embodiments, the second and third adhesive dielectric materials 106, 2208 may have the same compositions while the first adhesive dielectric material 104 may have a different composition. In some embodiments, the first adhesive dielectric material 104 may comprise a dielectric, non-adhesive material, as the second and the third adhesive dielectric materials 106, 2208 may provide adherence to superimposed components to be electrically connected and mechanically joined. In use (e.g., in forming the compressed structure of FIG. 3B), the third adhesive dielectric material 2208 may be squeezed away from area directly between the discrete conductive regions 102 and conductive elements 320 (FIG. 3B) above, joining the first and second adhesive dielectric materials 104, 106 in the regions laterally between the discrete conductive regions 102.

Accordingly, by the described method embodiment, formed is an ACF 2200 comprising discrete conductive regions 102 comprising a solid sub-region of the conductive carbon-based material 502 and the seed material 504 in direct contact with the sidewall 506 (FIG. 5) and the upper surface 508 (FIG. 5) of the conductive carbon-based material 502 and also comprising three regions of adhesive dielectric material: a region of the first adhesive dielectric material 104 laterally adjacent, the discrete conductive regions 102, a region of the second adhesive dielectric material 106 below the discrete conductive regions 102, and a region of the third adhesive dielectric material 2208 above the discrete conductive regions 102. The ACF 2000 may then be used in the manner described above with regard to FIGS. 3A through 4.

Figure 22:
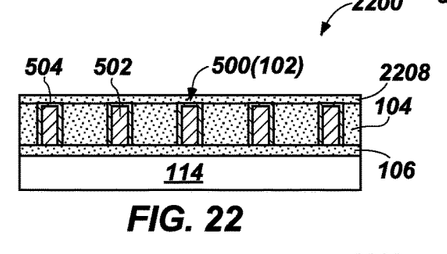

While FIGS. 21 and 22 illustrate the formation of the third adhesive dielectric material 2208 in conjunction with the formation of an ACF 2200 with the structures 500 of FIG. 5, it should be appreciated that the third adhesive dielectric material 2208 may be formed as an alternative to forming an upper portion of the first adhesive dielectric material 104 in any other method embodiment of this disclosure.

Figure 23:
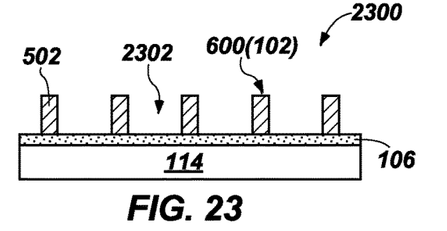
FIGS. 23 and 24, in conjunction with FIGS. 1 through 19, are cross-sectional, elevational, schematic illustrations during various stages of processing to fabricate the anisotropic conductive film of any of FIGS. 1 through 4, according to the structural embodiment of the carbon-based conductive region of FIG. 6 and according to a method embodiment of the disclosure.

In some such other method embodiment, the discrete conductive regions 102 with the structures 600 of FIG. 6 may be formed. For example, after the method stage of FIG. 19, the seed material 504 may be removed (e.g., by etching), forming structure 2300 of FIG. 23, having the structures 600, consisting of the conductive carbon-based material 502, spaced by open volume 2302 that is wider between the structures 600 than the open volume 1902 between the conductive structures 500 of FIG. 19. The first adhesive dielectric material 104 (or the first adhesive dielectric material 104 and then the third adhesive dielectric material 2208 (FIG. 22)) may then be formed to fill the open volume 1902 and cover the structures 600 of the discrete conductive regions 102, forming ACF 2400 of FIG. 24.

Figure 24:
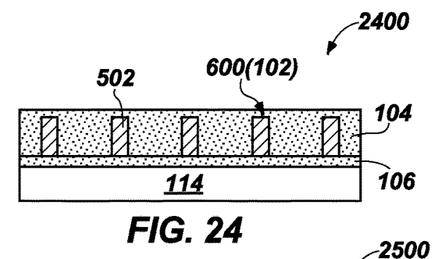

Accordingly, by the described method embodiment, formed is the ACF 2400 comprising discrete conductive regions 102 comprising a solid sub-region of only the conductive carbon-based material 502 and also comprising at least two regions of adhesive dielectric material. The ACF 2400 may then be used in the manner described above with regard to FIGS. 3 and 4.

Figure 25:
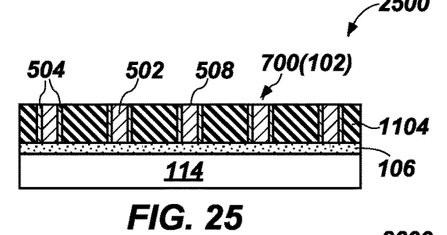
FIGS. 25 and 26, in conjunction with FIGS. 1 through 18, are cross-sectional, elevational, schematic illustrations during various stages of processing to fabricate the anisotropic conductive film of any of FIGS. 1 through 4, according to the structural embodiment of the carbon-based conductive region of FIG. 7 and according to a method embodiment of the disclosure.
Figure 26:
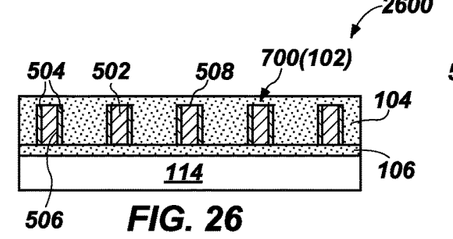
Figure 27:
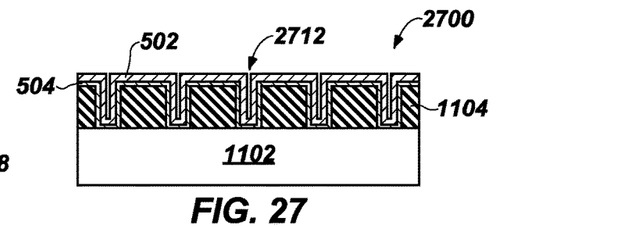
FIGS. 27 through 31, in conjunction with FIGS. 1 through 13, are cross-sectional, elevational, schematic illustrations during various stages of processing to fabricate the anisotropic conductive film of any of FIGS. 1 through 4, according to the structural embodiment of the carbon-based conductive region of FIG. 8 and according to a method embodiment of the disclosure.
Figure 28:
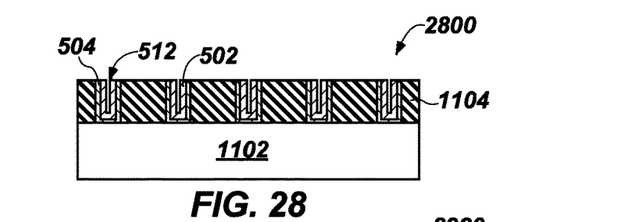
Figure 29:
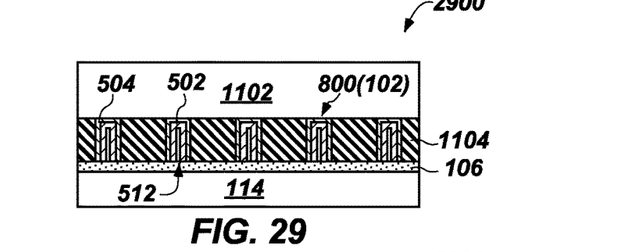
Figure 30:
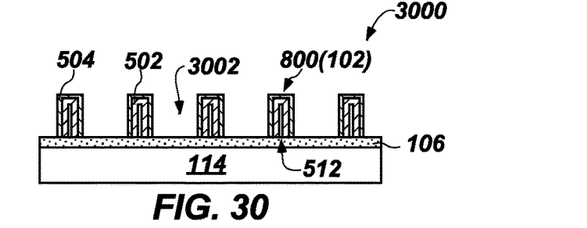

With reference to FIGS. 25 and 26, illustrated are stages in a method embodiment for forming an ACF 2600 with the discrete conductive regions 102 having the structure 700 of FIG. 7. For example, after or with the stage of FIG. 18, the structure 1800 may be further subjected to, e.g., planarization to remove at the elevation of material comprising the seed material 504 covering the upper surface 508 of the conductive carbon-based material 502, forming structure 2500 of FIG. 25. The dielectric material 1104 may then be removed in the same manner described above with respect to FIG. 18, and the first adhesive dielectric material 104 (or the first adhesive dielectric material 104 and the third adhesive dielectric material 2208) formed in the same manner described above to cover the structures 700 of the discrete conductive regions 102, forming an ACF 2600 illustrated in FIG. 26.

Accordingly, by the described method embodiment, formed is the ACF 2600 comprising discrete conductive regions 102 comprising a solid sub-region of the conductive carbon-based material 502 with the seed material 504 along the sidewall 506 of the conductive carbon-based material 502 and with the upper surface 508 of the conductive carbon-based material 502 in direct contact with the adhesive dielectric material (e.g., the first adhesive dielectric material 104 or, alternatively, the third adhesive dielectric material 2208). The ACF 2600 also comprises at least two regions of adhesive dielectric material, and it may be used in the manner described above with regard to FIGS. 3 and 4.

With reference to FIGS. 27 through 31, illustrated are stages in a method embodiment for forming an ACF 3100 with the discrete conductive regions 102 having the structure 800 of FIG. 8. For example, after the stage of FIG. 13, the conductive carbon-based material 502 may be conformally formed, in the same manner described above, but without filling the openings 1306 (FIG. 13) complete. Rather, a "keyhole" space 2712 (FIG. 27) may remain, forming structure 2700 of FIG. 27. Portions of the conductive carbon-based material 502 and the seed material 504 extending over the dielectric material 1104 may then be removed in the same manner as described above with respect to FIG. 15, forming structure 2800 of FIG. 28. The structure 2800 may then be flipped (e.g., inverted) and joined to the structure 1600 (FIG. 16) separately formed with the adhesive dielectric material (e.g., the second adhesive dielectric material 106), in the same manner described above with respect to FIGS. 16 and 17, forming joined structure 2900 of FIG. 29. Subsequent removal of the sacrificial base material 1102 and the dielectric material 1104, in the same manner described above with respect to FIGS. 18 and 19, leaves structure 3000 of FIG. 30 with openings 3002 between the structures 800 of the discrete conductive regions 102. As described above with respect to FIG. 20, adhesive dielectric material (e.g., the first adhesive dielectric material 104 or the first adhesive dielectric material 104 and the third adhesive dielectric material 2208) may then be formed to fill the openings 3002, forming the ACF 3100 with the discrete conductive regions 102 having the structure 800 of FIG. 8.

Figure 31:
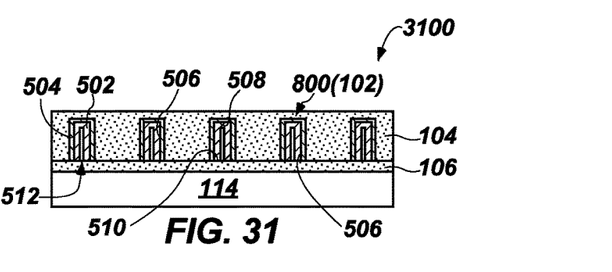

Accordingly, by the described method embodiment, formed is the ACF 3100 comprising discrete conductive regions 102 comprising a sub-region of the conductive carbon-based material 502 defining, therein, a void space (e.g., a void space extending upward from the lower surface 510), and with the seed material 504 along the sidewall 506 and upper surface 508 of the conductive carbon-based material 502. The ACF 3100 also comprises at least two regions of adhesive dielectric material, and it may be used in the manner described above with regard to FIGS. 3 and 4.

Figure 32:
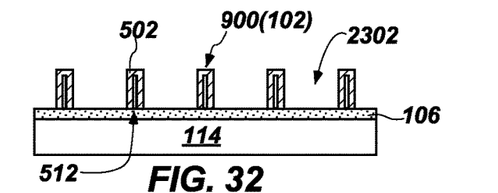
FIGS. 32 and 33, in conjunction with FIGS. 1 through 13 and 27 through 30, are cross-sectional, elevational, schematic illustrations during various stages of processing to fabricate the anisotropic conductive film of any of FIGS. 1 through 4, according to the structural embodiment of the carbon-based conductive region of FIG. 9 and according to a method embodiment of the disclosure.
Figure 33:
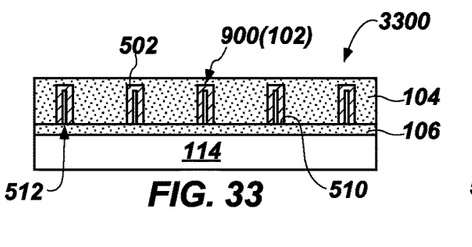

With reference to FIGS. 32 and 33, illustrated are stages in a method embodiment for forming an ACF 3300 with the discrete conductive regions 102 having the structure 900 of FIG. 9. For example, after the stage of FIG. 30, the seed material 504 may be removed in the same manner described above with respect to FIG. 23, leaving the structure 900 consisting of the conductive carbon-based material 502 defining, therein, the void space 512. The first adhesive dielectric material 104 (or the first adhesive dielectric material 104 and the third adhesive dielectric material 2208) may then be from in the open volume 2302 between the structures 900 and over the structures 900 to form the ACF 3300 of FIG. 33.

Accordingly, by the described method embodiment, formed is the ACF 3300 comprising discrete conductive regions 102 consisting of the conductive carbon-based material 502 defining, therein, a void space (e.g., a void space extending upward from the lower surface 510). The ACF 3300 also comprises at least two regions of adhesive dielectric material, and it may be used in the manner described above with regard to FIGS. 3 and 4.

Figure 34:
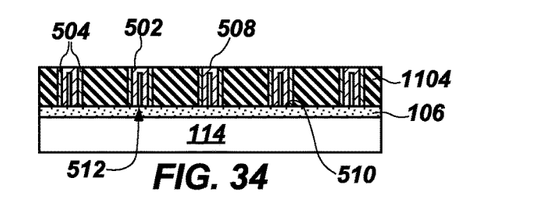
FIGS. 34 and 35, in conjunction with FIGS. 1 through 13 and 27 through 29, are cross-sectional, elevational, schematic illustrations during various stages of processing to fabricate the anisotropic conductive film of any of FIGS. 1 through 4, according to the structural embodiment of the carbon-based conductive region of FIG. 10 and according to a method embodiment of the disclosure.
Figure 35:
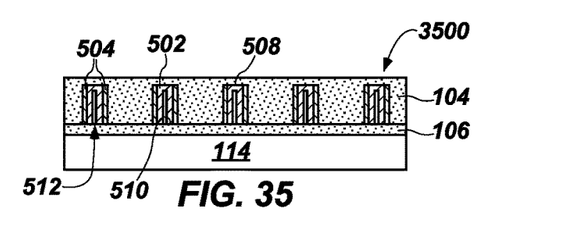

With reference to FIGS. 34 and 35, illustrated are stages in a method embodiment for forming an ACF 3500 with the discrete conductive regions 102 having the structure 1000 of FIG. 10. For example, after the stage of FIG. 29, the sacrificial base material 1102 may be removed in the same manner described above, and portions of the seed material 504 may be removed to expose the upper surface 508 of the conductive carbon-based material 502, in the same manner described above with respect to FIG. 25. Following removing of the dielectric material 1104 (e.g., in the same manner described above with respect to FIG. 25), the first adhesive dielectric material 104 (or the first adhesive dielectric material 104 and the third adhesive dielectric material 2208) may be formed to form the ACF 3500 of FIG. 35.

Accordingly, by the described method embodiment, formed is the ACF 3500 comprising discrete conductive regions 102 comprising the conductive carbon-based material 502 defining, therein, a void space (e.g., a void space extending upward from the lower surface 510) and having the seed material 504 along the sidewall 506 of the conductive carbon-based material 502. The ACF 3500 also comprises at least two regions of adhesive dielectric material, and it may be used in the manner described above with regard to FIGS. 3 and 4.

Figure 36:
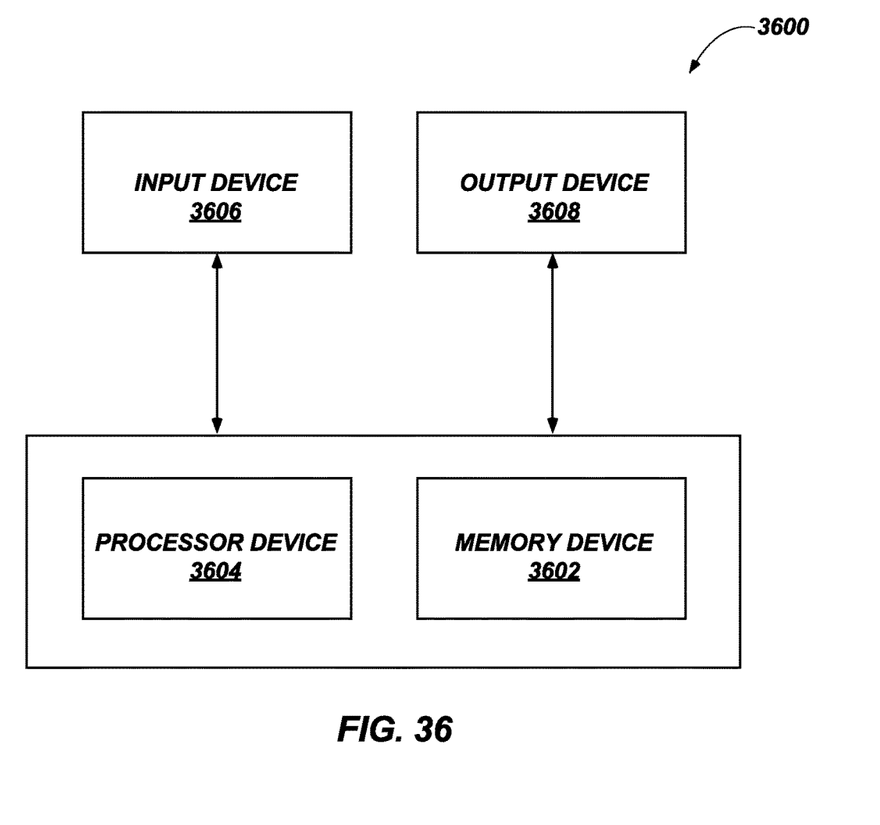
FIG. 36 is a block diagram of an electronic system including at least one semiconductor device assembly with at least one anisotropic conductive film according to one or more embodiments of the disclosure.

Semiconductor device assemblies (e.g., the semiconductor device package of FIG. 4, with at least one of the ACFs of this disclosure (e.g., ACF 100 (FIGS. 1, 3, and 4); ACF 200 (FIG. 2), ACF 2000 (FIG. 20), ACF 2200 (FIG. 22), ACF 2400 (FIG. 24), ACF 2600 (FIG. 26), ACF 3100 (FIG. 31), ACF 3300 (FIG. 33), ACF 3500 (FIG. 35))), in accordance with embodiments of the disclosure, may be used in embodiments of electronic systems of the disclosure. For example, with reference to FIG. 36, shown is a block diagram of an illustrative electronic system 3600, according to embodiments of the disclosure. The electronic system 3600 may comprise, by way of non-limiting example, a computer or computer hardware component, a server or other networking hardware component, a cellular telephone, a digital camera, a personal digital assistant (PDA), a portable media (e.g., music) player, a Wi-Fi or cellular-enabled tablet (e.g., an IPAD® or SURFACE® tablet, an electronic book, an electronic reader, a navigation device). The electronic system 3600 includes at least one memory device 3602. The memory device 3602 may include, for example, an embodiment of a semiconductor device assembly (e.g., the semiconductor device package of FIG. 4, with at least one of the ACFs of this disclosure (e.g., ACF 100 (FIGS. 1, 3, and 4); ACF 200 (FIG. 2), ACF 2000 (FIG. 20), ACF 2200 (FIG. 22), ACF 2400 (FIG. 24), ACF 2600 (FIG. 26), ACF 3100 (FIG. 31), ACF 3300 (FIG. 33), ACF 3500 (FIG. 35))) described herein. Such memory device may, optionally, include dice (e.g., the semiconductor die 304 (FIG. 3) or 314 (FIG. 3)) configured for other functions (e.g., a logic die, an RF die, or both). The electronic system 3600 may further include at least one electronic signal processor device 3604 (often referred to as a "microprocessor"). The electronic system 3600 may further include one or more input devices 3606 for inputting information into the electronic system 3600 by a user, e.g., using a mouse or other pointing device, a keyboard, a touchpad, a button, or a control panel. The electronic system 3600 may further include one or more output devices 3608 for outputting information (e.g., visual or audio output) to a user by, e.g., a monitor, a display, a printer, an audio output jack, a speaker, etc. In some embodiments, the input device 3606 and the output device 3608 may comprise a single touchscreen device that can be used both to input information to the electronic system 3600 and to output visual information to a user. The input device 3606 and the output device 3608 may communicate electrically with one or more of the memory devices 3602 and the electronic signal processor device 3604. It is also contemplated that, in lieu of separate memory and signal processor devices 3602 and 3604, a single assembly 3600 may be configured as a system in a package including a processor and/or other die functionalities.

Accordingly, disclosed is an electronic system comprising at least one input device, at least one output device, a processor device, and a semiconductor device. The processor device is operably coupled to the at least one input device and to the at least one output device. The semiconductor device comprises at least one memory die and an anisotropic conductive film in contact with the at least one memory die. The anisotropic conductive film comprises an ordered array of discrete conductive regions comprising a conductive carbon-based material.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with or substituted for features of another disclosed embodiment while still being encompassed within the scope of the disclosure.

What is claimed is:

1. An anisotropic conductive film, comprising:
   a pattern of discrete regions mutually laterally spaced by at least one predetermined pitch, each discrete region comprising a conductive carbon-based material; and
   adhesive dielectric material between, above, and below the discrete regions,
   the anisotropic conductive film having a height, defined as a distance from a lowermost surface of the adhesive dielectric material to an uppermost surface of the adhesive dielectric material, of less than about 0.4 μm.

2. The anisotropic conductive film of claim 1, wherein the conductive carbon-based material comprises graphene.

3. The anisotropic conductive film of claim 1, wherein the discrete regions further comprise a seed material on one or more surfaces of the conductive carbon-based material.

4. The anisotropic conductive film of claim 3, wherein the seed material comprises at least one of nickel or copper.

5. The anisotropic conductive film of claim 3, wherein the seed material is disposed on a sidewall of the conductive carbon-based material.

6. The anisotropic conductive film of claim 5, wherein the seed material is further disposed on at least one end surface of the conductive carbon-based material.

7. The anisotropic conductive film of claim 1, wherein the discrete regions consist of the conductive carbon-based material.

8. The anisotropic conductive film of claim 1, wherein:
   at least some of the discrete regions each define a void space within the conductive carbon-based material;
   the void space borders sidewalls of the conductive carbon-based material; and
   an upper surface of the conductive carbon-based material extends over the void space.

9. The anisotropic conductive film of claim 1, wherein the discrete regions are free of aluminum, silver, and tin.

10. The anisotropic conductive film of claim 1, wherein each of the discrete regions extends through a majority of the height of the anisotropic conductive film.

11. The anisotropic conductive film of claim 1, wherein the conductive carbon-based material exhibits an electrical resistivity of about $10^{-6}$ Ω·m or less.

12. The anisotropic conductive film of claim 1, wherein the adhesive dielectric material between, above, and below the discrete regions comprises:
   a first adhesive dielectric material between the discrete regions; and
   a second adhesive dielectric material below the discrete regions.

13. The anisotropic conductive film of claim 12, wherein the first adhesive dielectric material between the discrete regions has a different composition than the second adhesive dielectric material below the discrete regions.

14. The anisotropic conductive film of claim 12, wherein the first adhesive dielectric material and the second adhesive dielectric material are of a same composition.

15. A semiconductor device assembly, comprising:
a semiconductor die comprising a pattern of conductive elements;
another semiconductor die comprising a same pattern of conductive elements superimposed on the semiconductor die with the patterns aligned; and
an anisotropic conductive film between the semiconductor die and the other semiconductor die, the anisotropic conductive film comprising:
a pattern of discrete regions mutually laterally spaced by at least one predetermined pitch, each discrete region comprising a conductive carbon-based material; and
adhesive dielectric material between, above, and below the discrete regions,
the anisotropic conductive film having a height, defined as a distance from a lowermost surface of the adhesive dielectric material to an uppermost surface of the adhesive dielectric material, of less than about 0.4 µm.

16. The semiconductor device assembly of claim 15, wherein at least one of the discrete regions of the pattern extends directly between a conductive element of the semiconductor die and an aligned conductive element of the other semiconductor die.

17. The semiconductor device assembly of claim 15, wherein the conductive carbon-based material comprises at least 50 at. % graphene.

18. The semiconductor device assembly of claim 17, wherein the conductive carbon-based material consists of graphene.

19. The semiconductor device assembly of claim 15, wherein the conductive carbon-based material is laterally spaced, from the adhesive dielectric material between the discrete regions, by a seed material.

20. The semiconductor device assembly of claim 15, wherein the conductive carbon-based material defines a void space.

21. The semiconductor device assembly of claim 20, wherein the void space is adjacent a lower surface of the conductive carbon-based material.

22. A method for forming an anisotropic conductive film, the method comprising:
forming a precursor structure, comprising:
forming, on a sacrificial base material, a dielectric material;
defining discrete openings in the dielectric material;
forming a seed material in the discrete openings; and
forming a carbon-based material on the seed material;
forming another structure comprising an adhesive dielectric material on another base material;
joining the precursor structure, on a surface thereof opposite the sacrificial base material, to the other structure;
removing the sacrificial base material;
removing the dielectric material to form additional openings; and
forming additional adhesive dielectric material above the carbon-based material and in the additional openings to electrically insulate the carbon-based material,
the anisotropic conductive film formed by the method comprising:
a pattern of discrete regions mutually laterally spaced by at least one predetermined pitch, each discrete region comprising a conductive carbon-based material formed from the carbon-based material;
the adhesive dielectric material below the discrete regions; and
the additional adhesive dielectric material between and above the discrete regions,
the anisotropic conductive film having a height, defined as a distance from a lowermost surface of the adhesive dielectric material to an uppermost surface of the additional adhesive dielectric material, of less than about 0.4 µm thin.

23. The method of claim 22, wherein defining discrete openings in the dielectric material comprises patterning the dielectric material to expose regions of the sacrificial base material.

24. The method of claim 23, wherein forming a seed material in the discrete openings comprises conformally forming the seed material on the dielectric material and the regions of the sacrificial base material, leaving other openings defined by the seed material.

25. The method of claim 24, wherein forming a carbon-based material on the seed material comprises conformally forming graphene on the seed material.

26. The method of claim 24, wherein forming the precursor structure further comprises, after forming the carbon-based material on the seed material, removing portions of the carbon-based material and the seed material to form the discrete regions of the pattern of discrete regions, the discrete regions comprising the carbon-based material and the seed material.

27. The method of claim 22, wherein joining the precursor structure to the other structure comprises inverting the precursor structure.

28. The method of claim 22, further comprising, with or after removing the dielectric material, removing the seed material to form the additional openings.

29. The method of claim 28, wherein forming the additional adhesive dielectric material above the carbon-based material and in the additional openings comprises forming the additional adhesive dielectric material directly on the carbon-based material.

30. A method for forming a semiconductor assembly, the method comprising:
adhering, above a surface of a semiconductor die, an anisotropic conductive film comprising a pattern of discrete regions mutually laterally spaced by at least one predetermined pitch, each discrete region comprising a conductive carbon-based material, the anisotropic conductive film further comprising an adhesive dielectric material between, above, and below the discrete regions, the anisotropic conductive film having a height, defined as a distance from a lowermost surface of the adhesive dielectric material to an uppermost surface of the adhesive dielectric material, of less than about 0.4 µm;
adhering, above the anisotropic conductive film, a surface of another semiconductor die; and
compressing the anisotropic conductive film between the semiconductor die and the other semiconductor die to displace at least some of the adhesive dielectric material and directly contact at least some of the discrete regions with conductive elements of each of the semiconductor die and the other semiconductor die.

31. The method of claim 30, wherein the conductive carbon-based material comprises at least fifty atomic percent graphene.

32. An electronic system comprising:
at least one input device;
at least one output device;
a processor device operably coupled to the at least one input device and to the at least one output device; and
a semiconductor device comprising:
   at least one memory die; and
   an anisotropic conductive film in contact with the at least one memory die, the anisotropic conductive film comprising:
      a pattern of discrete regions mutually laterally spaced by at least one predetermined pitch, each discrete region comprising a conductive carbon-based material; and
      an adhesive dielectric material between, above, and below the discrete regions,
      the anisotropic conductive film having a height, defined as a distance a lowermost surface of the adhesive dielectric material to an uppermost surface of the adhesive dielectric material, of less than about 0.4 μm.

33. The electronic system of claim 32, wherein the discrete regions consist essentially of graphene.

34. The electronic system of claim 32, wherein:
the conductive carbon-based material comprises graphene; and
the discrete regions further comprise a seed material directly adjacent the graphene.

\* \* \* \* \*

UNITED STATES PATENT AND TRADEMARK OFFICE
CERTIFICATE OF CORRECTION

PATENT NO. : 11,189,588 B2
APPLICATION NO. : 16/236687
DATED : November 30, 2021
INVENTOR(S) : Nakano et al.

Page 1 of 1

It is certified that error appears in the above-identified patent and that said Letters Patent is hereby corrected as shown below:

In the Specification

Column 4, Line 67, change "silicon-on-insulator ("SOT")" to
-- silicon-on-insulator ("SOI") --

Signed and Sealed this
Twenty-eighth Day of December, 2021

Drew Hirshfeld
*Performing the Functions and Duties of the*
*Under Secretary of Commerce for Intellectual Property and*
*Director of the United States Patent and Trademark Office*